US011296157B2

(12) United States Patent
Won et al.

(10) Patent No.: US 11,296,157 B2
(45) Date of Patent: Apr. 5, 2022

(54) DISPLAY DEVICE

(71) Applicant: LG Display Co., Ltd., Seoul (KR)

(72) Inventors: Sang-Hyuk Won, Gimpo-si (KR); Min-Joo Kim, Seoul (KR); Jae-Won Lee, Goyang-si (KR); Sang-Hoon Pak, Seoul (KR); Byong-Hoo Kim, Paju-si (KR); Ji-Hye Lee, Seoul (KR); Jae-Man Jang, Seoul (KR); Sung-Jin Kim, Seoul (KR); Jae-Hyung Jang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/112,963

(22) Filed: Dec. 4, 2020

(65) Prior Publication Data

US 2021/0091144 A1 Mar. 25, 2021

Related U.S. Application Data

(63) Continuation of application No. 16/666,136, filed on Oct. 28, 2019, now Pat. No. 10,886,339.

(30) Foreign Application Priority Data

Nov. 9, 2018 (KR) .......................... 10-2018-0137577

(51) Int. Cl.
*H01L 27/32* (2006.01)
*G06F 3/044* (2006.01)
(Continued)

(52) U.S. Cl.
CPC .......... *H01L 27/323* (2013.01); *G06F 3/0412* (2013.01); *G06F 3/0446* (2019.05);
(Continued)

(58) Field of Classification Search
CPC . G06F 2203/04102; G06F 2203/04111; G06F 2203/04112; G06F 3/0412;
(Continued)

(56) References Cited

U.S. PATENT DOCUMENTS 10,698,523 B2   6/2020 Jang et al.
10,761,663 B2   9/2020 Wada et al.
(Continued)

FOREIGN PATENT DOCUMENTS

EP          3258358 A1   12/2017
WO   WO 2017/195451 A1   11/2017

OTHER PUBLICATIONS

European Patent Office, Extended European Search Report and Opinion, EP Patent Application No. 19202695.3, dated Dec. 20, 2019, seven pages.
(Continued)

*Primary Examiner* — Hong Zhou
(74) *Attorney, Agent, or Firm* — Fenwick & West LLP

(57) ABSTRACT

A display device prevents cracks from spreading to an active area. The display device includes a substrate including an active area and a non-active area having a bending area, a thin-film transistor disposed in the active area, a light-emitting element disposed in the active area and connected to the thin-film transistor, an encapsulation layer disposed on the light-emitting element, a touch sensor disposed on the encapsulation layer, a touch pad disposed in the non-active area, a first routing line connecting the touch sensor to the touch pad via a second routing line in the bending area, and a crack prevention layer disposed on the second routing line in the bending area. Thus, the crack prevention layer is capable of preventing the occurrence of cracks in the bending area BA, thus preventing cracks from spreading to the active area AA.

10 Claims, 15 Drawing Sheets

(51) Int. Cl.
  *G06F 3/041* (2006.01)
  *H01L 51/00* (2006.01)
  *H01L 51/52* (2006.01)

(52) U.S. Cl.
  CPC ...... *G06F 3/04164* (2019.05); *H01L 27/3258* (2013.01); *H01L 27/3276* (2013.01); *H01L 51/0097* (2013.01); *H01L 51/5253* (2013.01); *G06F 2203/04102* (2013.01); *G06F 2203/04111* (2013.01); *G06F 2203/04112* (2013.01); *H01L 27/322* (2013.01)

(58) Field of Classification Search
  CPC .. G06F 3/04164; G06F 3/0443; G06F 3/0446; H01L 27/322; H01L 27/323; H01L 27/3258; H01L 27/3276; H01L 51/0097; H01L 51/5253
  See application file for complete search history.

(56) References Cited

U.S. PATENT DOCUMENTS

| | | | |
|---|---|---|---|
| 2015/0036300 A1 | 2/2015 | Park et al. | |
| 2016/0170524 A1 | 6/2016 | Kim et al. | |
| 2016/0307971 A1 | 10/2016 | Jeon | |
| 2017/0090634 A1 | 3/2017 | Yang et al. | |
| 2017/0090661 A1 | 3/2017 | Kim et al. | |
| 2017/0262109 A1 | 9/2017 | Choi et al. | |
| 2017/0364194 A1 | 12/2017 | Jang et al. | |
| 2018/0047920 A1 | 2/2018 | Jang | |
| 2018/0053815 A1 | 2/2018 | Lee et al. | |
| 2018/0061899 A1 | 3/2018 | Oh et al. | |
| 2018/0090702 A1 | 3/2018 | Um et al. | |
| 2018/0095582 A1 | 4/2018 | Hwang et al. | |
| 2018/0145125 A1* | 5/2018 | Lee | H01L 27/3262 |
| 2018/0151662 A1* | 5/2018 | Rhe | G06F 3/0412 |
| 2018/0166652 A1 | 6/2018 | Kim et al. | |
| 2019/0019966 A1 | 1/2019 | Jiang et al. | |
| 2019/0050083 A1 | 2/2019 | Wada et al. | |
| 2019/0095007 A1 | 3/2019 | Jeong et al. | |
| 2019/0207130 A1 | 7/2019 | He et al. | |
| 2020/0293141 A1 | 9/2020 | Jang et al. | |

OTHER PUBLICATIONS

United States Office Action, U.S. Appl. No. 16/666,136, filed Jun. 24, 2020, 21 pages.

European Patent Office, Office Action, EP Patent Application No. 19202695.3, dated Dec. 14, 2021, seven pages.

* cited by examiner

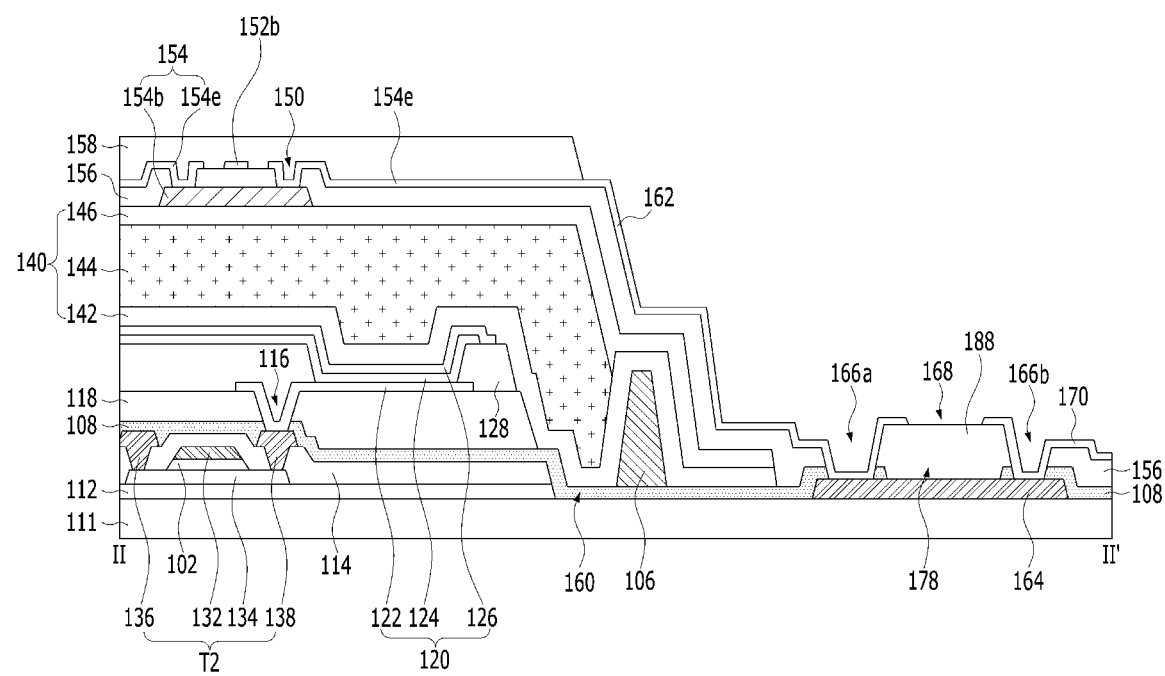
FIG. 5
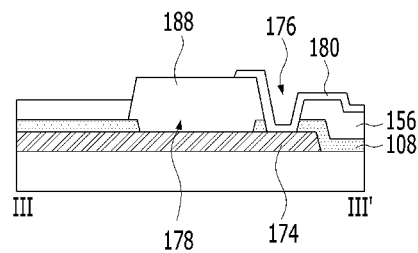

DISPLAY DEVICE

CROSS-REFERENCE TO RELATED APPLICATIONS

This application is a continuation application of U.S. patent application Ser. No. 16/666,136, filed on Oct. 28, 2019, which claims the benefit of Republic of Korea Patent Application No. 10-2018-0137577, filed on Nov. 9, 2018, which is hereby incorporated by reference in its entirety as if fully set forth herein.

RELATED FIELD

The present disclosure relates to a display device, and more particularly to a display device for simplifying the structure thereof.

BACKGROUND

A touchscreen is an input device through which a user may input a command by selecting instructions displayed on a screen of a display device using a hand or an object. That is, the touchscreen converts a contact position that directly contacts a human hand or an object into an electrical signal and receives selected instructions based on the contact position as an input signal. Such a touchscreen may substitute for a separate input device that is connected to a display device and operated, such as a keyboard or a mouse, and thus the range of application of the touchscreen has continually increased.

In general, a touchscreen is attached to the front surface of a display panel, such as a liquid crystal display panel or an organic electroluminescent display panel, using an adhesive. In this case, since the touchscreen is separately manufactured and then attached to the front surface of the display panel, an additional attachment process is carried out, and thus the overall process and the structure thereof become complicated and manufacturing costs are increased.

The display panel has an active area AA and a non-active area NA disposed adjacent to the active area AA. The non-active area NA includes a bending area BA for bending or folding the display panel. The bending area BA corresponds to the area that is bent in order to place the non-display area such as a scan driver and a data driver on the rear surface of the active area AA. Accordingly, the area occupied by the active area AA is maximized and the area corresponding to the non-active area NA is minimized on the entire screen of the display device. However, the bending area BA easily cracks due to bending stress and the crack tends to spread to the active area AA, thereby resulting in the occurrence of defects in the lines and malfunction of the device.

SUMMARY OF THE INVENTION

Accordingly, the present disclosure is directed to a display device that substantially obviates one or more problems due to limitations and disadvantages of the related art.

An object of the present disclosure is to provide a display device for alleviating bending stress caused by bending of the display panel to prevent cracking of the bending area BA and prevent cracks from spreading to the active area AA.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device including an active area and a non-active area having a bending area includes a substrate, a thin-film transistor disposed on the substrate in the active area, a light-emitting element disposed on the substrate in the active area and connected to the thin-film transistor, an encapsulation layer disposed on the light-emitting element, a touch sensor disposed on the encapsulation layer, a touch pad disposed in the non-active area, a first routing line connecting the touch sensor to the touch pad via a second routing line in the bending area, and a crack prevention layer disposed on the second routing line in the bending area. Thus, since a crack prevention layer is disposed on the second routing line in the bending area, the crack prevention layer alleviates bending stress caused by bending of the substrate. Accordingly, the crack prevention layer is capable of preventing the occurrence of cracks in the bending area BA, thus preventing cracks from spreading to the active area AA.

Preferably, the display device further comprises a passivation layer disposed on the thin-film transistor and extending into the non-active area.

Preferably, the passivation layer is at least partially disposed on the second routing line in the bending area.

Preferably, the crack prevention layer contacts the second routing line in the bending area.

Preferably, the display device further comprises at least one contact hole connecting the first routing line and the second routing line.

Preferably, the first routing line is at least partially disposed on a side surface of the crack prevention layer.

Preferably, the display device further comprises a touch buffer layer disposed between the encapsulation layer and the touch sensor.

Preferably, the crack prevention layer is formed of an organic insulation material, which is more elastic than an inorganic insulation material.

Preferably, the encapsulation layer comprises at least one inorganic encapsulation layer, and the passivation layer has a smaller thickness than the at least one inorganic encapsulation layer.

Preferably, the display device further comprises a planarization layer disposed on the passivation layer; and wherein the crack prevention layer is formed of a same material as the planarization layer.

Preferably, the second routing line and a display link connecting a display pad to a signal line may be disposed in the bending area BA across the bending area BA.

Preferably, at least one opening may be disposed in the bending area.

Preferably, the display link may be formed of the same material as at least one of a gate electrode, a source electrode and a drain electrode of the thin-film transistor.

Preferably, the display device may further comprise a color filter array including color filters and black matrixes disposed on the encapsulation layer.

Preferably, each of the black matrixes may be disposed between adjacent color filters.

Preferably, the touch sensor may comprise a plurality of first touch electrodes arranged in a first direction on the encapsulation layer; a plurality of second touch electrodes arranged in a second direction on the encapsulation layer; a first bridge connecting the first touch electrodes to each other; and a second bridge connecting the second touch electrodes to each other and intersecting the first bridge with a touch insulation film interposed therebetween.

Preferably, the first bridges and the second bridges may be disposed so as to overlap a bank defining a light-emitting area of the light-emitting element.

Preferably, the display device may further comprise a passivation layer disposed on the thin-film transistor and extending into the non-active area and a planarization layer disposed on the passivation layer, wherein the crack prevention layer is formed together with at least one of the planarization layer and the bank, the crack prevention layer is disposed in the same plane as at least one of the planarization layer and the bank and is formed of the same material.

Preferably, the second routing line and the display link may be formed of the same material as the second bridge.

Preferably, the display device may further comprises a passivation layer disposed on the thin-film transistor and extending into the non-active area, wherein the second routing line and the display link are protected by the passivation layer.

Preferably, the first touch electrode, the second touch electrode, the first bridge and the second bridge may be formed to have a mesh shape.

Preferably, at least one of the first touch electrode, the second touch electrode, the first bridge and the second bridge may be formed of only a mesh metal film.

Preferably, the mesh metal film may be formed to have a mesh shape using a conductive layer of at least one of Ti, Al, Mo, MoTi, Cu, Ta, and ITO.

Preferably, the mesh metal film is formed in a triple-layer stack structure of Ti/Al/Ti, MoTi/Cu/MoTi, or Ti/Al/Mo.

Preferably, at least one of the first touch electrode, the second touch electrode, the first bridge and the second bridge may include a plurality of open areas.

Preferably, the plurality of open areas are formed to overlap a light-emitting areas of the light-emitting element and the mesh metal film of each of the first and second touch electrodes and the first bridge are formed to overlap a bank defining a light-emitting area of the light-emitting element.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIG. 5 illustrates cross-sectional views taken along lines II-II' and III-III' in the organic light-emitting display device having a touch sensor illustrated in FIG. 4 according to an embodiment of the present disclosure.

DETAILED DESCRIPTION

Reference will now be made in detail to exemplary embodiments of the present disclosure, examples of which are illustrated in the accompanying drawings. Wherever possible, the same reference numbers will be used throughout the drawings to refer to the same or like parts.

Figure 1:
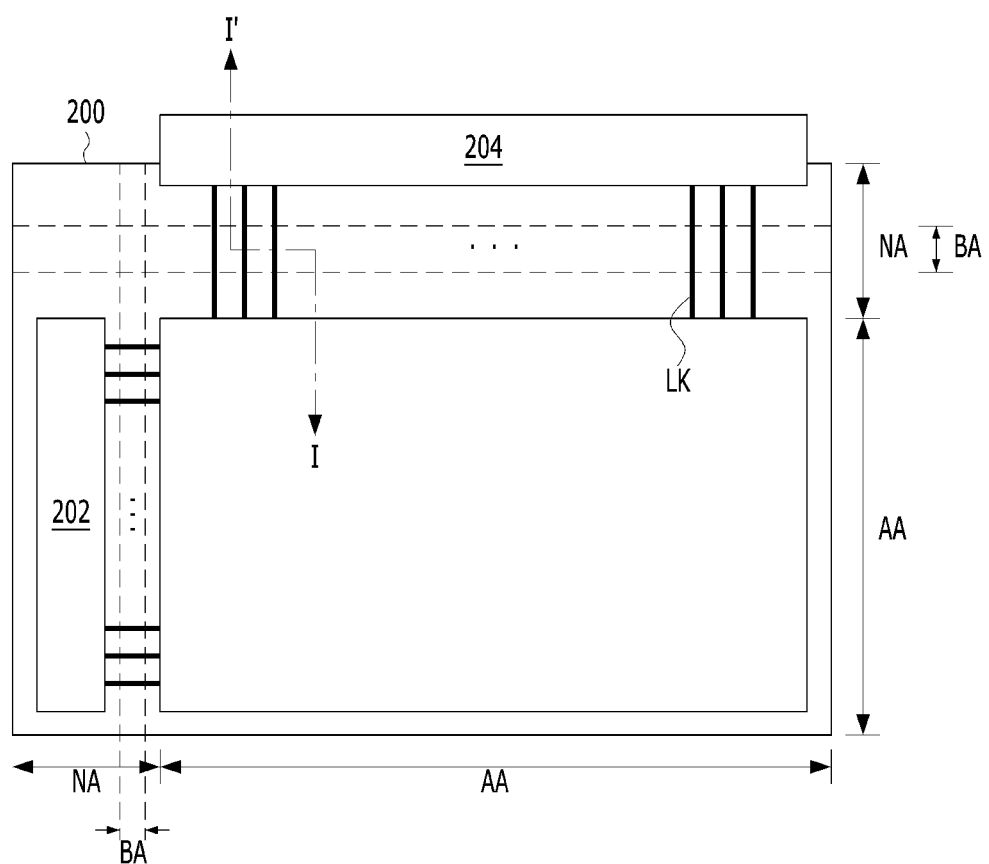
FIG. 1 is a block diagram illustrating a display device according to an embodiment of the present disclosure.
Figure 2:
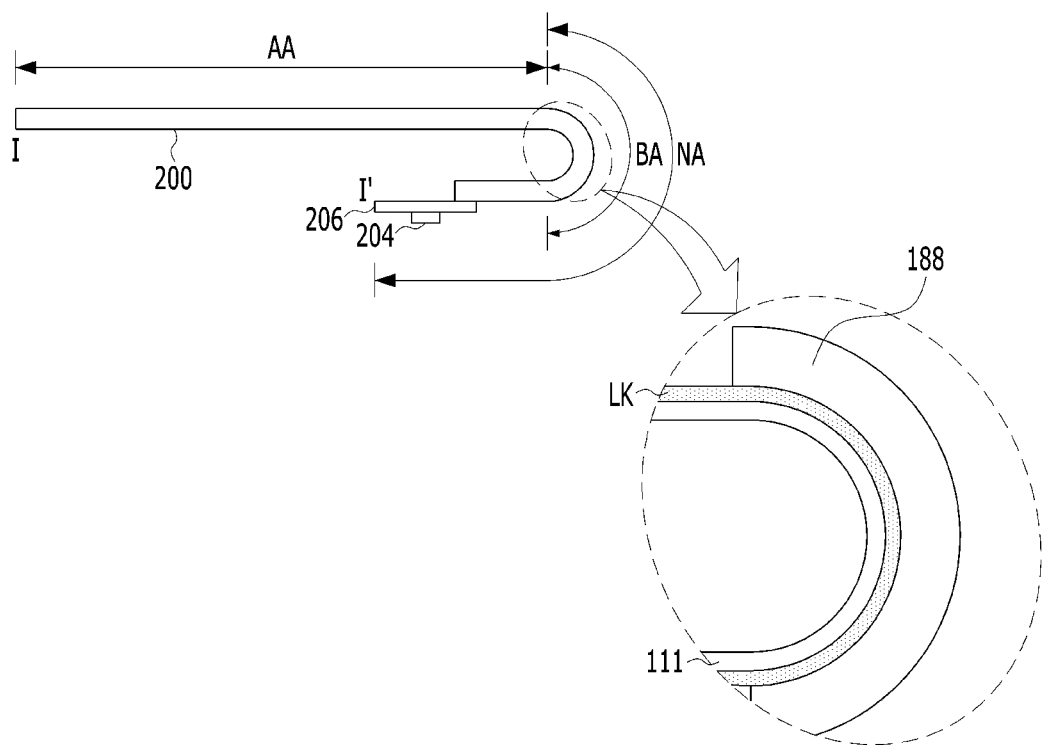
FIG. 2 is a cross-sectional view taken along line I-I' in the display device illustrated in FIG. 1 when the display device is bent according to an embodiment of the present disclosure.

FIG. 1 is a block diagram illustrating a display device according to an embodiment of the present disclosure, and FIG. 2 is a cross-sectional view illustrating the display device according to an embodiment of the present disclosure.

The display device illustrated in FIGS. 1 and 2 includes a display panel 200, a scan driver 202, and a data driver 204.

The display panel 200 has an active area AA disposed on a substrate 111 (see FIG. 3) and a non-active area NA disposed adjacent to the active area AA. The substrate 111 includes a flexible plastic material so as to be bendable. For example, the plastic material may be polyimide (PI), polyethylene terephthalate (PET), polyethylene naphthalate (PEN), polycarbonate (PC), polyethersulfone (PES), polyacrylate (PAR), polysulfone (PSF), or cyclic-olefin copolymer (COC).

The active area AA displays an image through unit pixels arranged in a matrix form. Each unit pixel includes red (R), green (G) and blue (B) sub-pixels, or includes red (R), green (G), blue (B), and white (W) sub-pixels.

At least one of the data driver 204 and the scan driver 202 may be disposed in the non-active area NA.

The scan driver 202 drives a scan line of the display panel 200. The scan driver 202 includes at least one of a thin-film transistor having an oxide semiconductor layer and a thin-film transistor having a polycrystalline semiconductor layer. Here, the thin-film transistor of the scan driver 202 is simultaneously formed through the same process as at least one thin-film transistor disposed in each subpixel of the active area AA.

The data driver 204 drives a data line of the display panel 200. The data driver 204 is installed on the substrate 111 in a chip form, or is installed on a signal transmission film 206 in a chip form, as illustrated in FIG. 2, so as to be attached to the non-active area NA of the display panel 200. The non-active area NA has a plurality of signal pads disposed so as to be electrically connected to the signal transmission film 206. Driving signals, which are generated in the data driver 204, the scan driver 202, a power source (not illustrated) and a timing controller (not illustrated), are supplied to the signal line disposed in the active area AA via the signal pads.

The non-active area NA includes a bending area BA for bending or folding the display panel 200. The bending area BA corresponds to the area that is bent in order to place the non-display area such as the scan driver 202 and the data driver 204 on the rear surface of the active area AA. As illustrated in FIG. 1, the bending area BA corresponds to a region between active area AA and the data driver 204 and a region between the active area AA and the scan driver 202. Alternatively, the bending area BA may be disposed within at least one of the upper side, the lower side, the left side and the right side of the non-active area NA. Accordingly, the area occupied by the active area AA is maximized and the area corresponding to the non-active area NA is minimized on the entire screen of the display device.

As illustrated in FIG. 2, a crack prevention layer 188 is disposed in the bending area BA so that the bending area BA is easily bent. The crack prevention layer 188 is formed of an organic insulation material, which is more elastic than an inorganic insulation material. Since the crack prevention layer 188 is formed of an organic insulation material, which has a higher strain rate than an inorganic insulation material, the crack prevention layer 188 alleviates bending stress caused by bending of the substrate 111. Accordingly, the crack prevention layer 188 is capable of preventing the occurrence of cracks in a signal link LK, which is disposed across the bending area BA, thus preventing cracks from spreading to the active area AA. Here, the signal link LK includes a signal line that extends from the active area to the pad area like a touch routing line or a display link.

The display device having the bending area BA may be applied to a liquid crystal display device or an organic light-emitting display device. In the present disclosure, an embodiment in which the display device having the bending area BA is applied to an organic light-emitting display device having a touch sensor will be described below by way of example.

Figure 3:
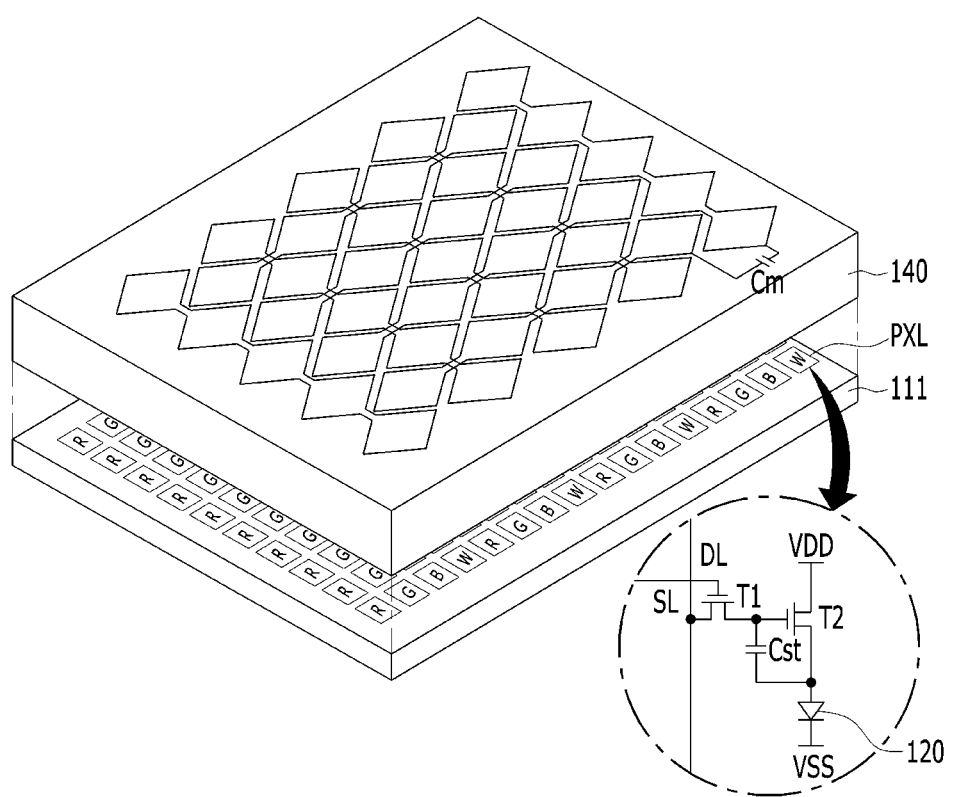
FIG. 3 is a perspective view illustrating an organic light-emitting display device having a touch sensor according to an embodiment of the present disclosure.
Figure 4:
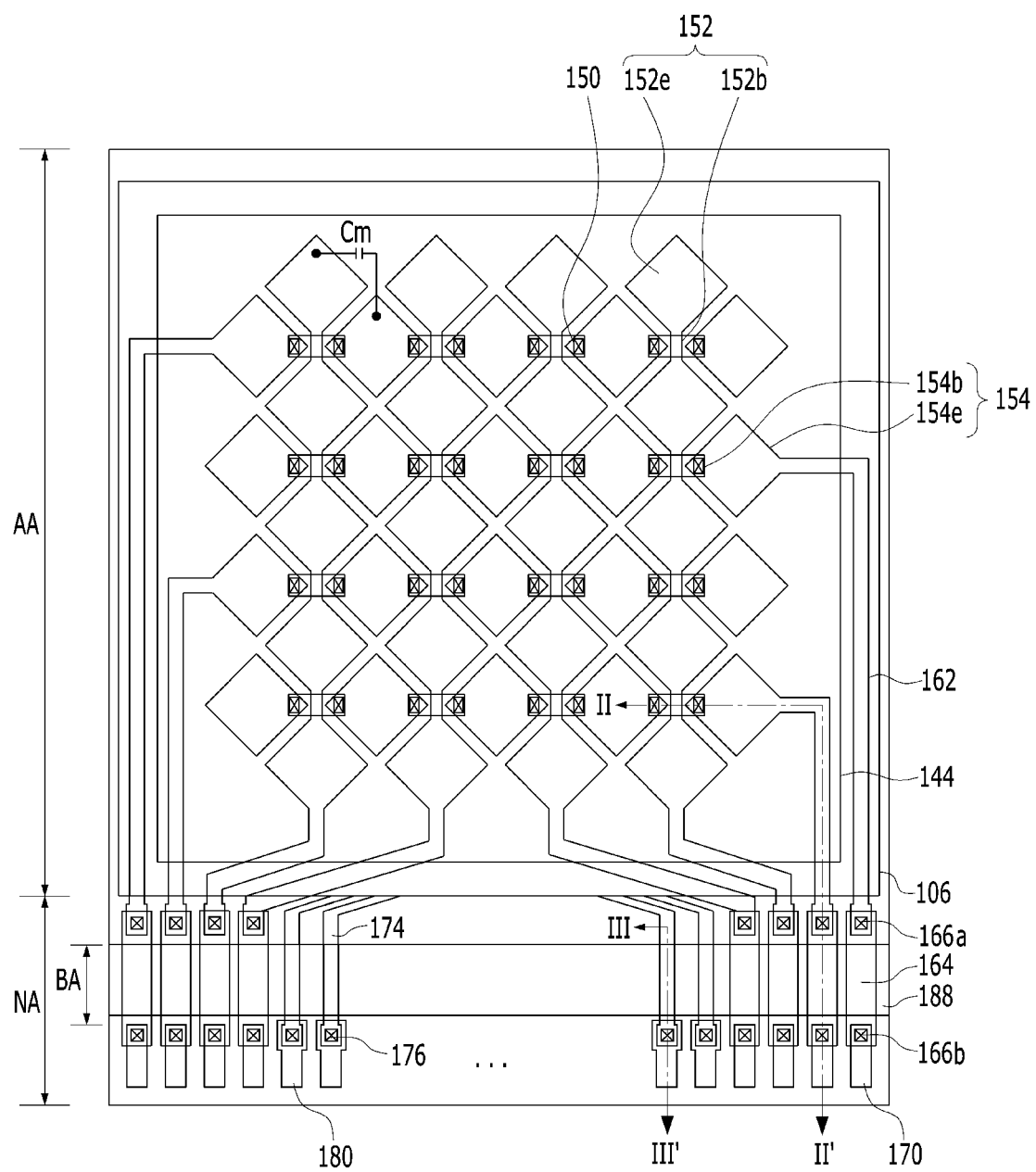
FIG. 4 is a plan view illustrating the organic light-emitting display device having a touch sensor according to an embodiment of the present disclosure.

An organic light-emitting display device having a touch sensor illustrated in FIGS. 3 and 4 includes a plurality of subpixels PXL arranged in a matrix form on the substrate 111, an encapsulation layer 140 disposed on the subpixels PXL, and a mutual capacitance array Cm disposed on the encapsulation layer 140.

The organic light-emitting display device having a touch sensor displays an image through a plurality of subpixels PXL, each including a light-emitting element 120, for a display period. In addition, the organic light-emitting display device having a touch sensor senses the presence or absence of a touch and a touch position by sensing a variation in mutual capacitance Cm (touch sensor) in response to a user touch for a touch period.

Each of the subpixels PXL disposed in the active area of the organic light-emitting display device having a touch sensor includes a pixel-driving circuit and the light-emitting element 120 connected to the pixel-driving circuit.

The pixel-driving circuit, as illustrated in FIG. 3, includes a switching transistor T1, a driving transistor T2, and a storage capacitor Cst. In the present invention, a structure in which the pixel-driving circuit includes two transistors T and one capacitor C has been described by way of example, but the present disclosure is not limited thereto. That is, a pixel-driving circuit having a structure in which three or more transistors T and one or more capacitors C, such as a 3T1C structure or 3T2C structure, are provided may be used.

The switching transistor T1 is turned on when a scan pulse is supplied to a scan line SL, and supplies a data signal supplied to a data line DL to the storage capacitor Cst and a gate electrode of the driving transistor T2.

The driving transistor T2 controls the current to be supplied from a high-voltage (VDD) supply line to the light-emitting element 120 in response to the data signal supplied to the gate electrode of the driving transistor T2, thereby adjusting the amount of light emitted from the light-emitting element 120. Then, even if the switching transistor T1 is turned off, the driving transistor T2 maintains the emission of light by the light-emitting element 120 by supplying a constant amount of current thereto using the voltage charged in the storage capacitor Cst until a data signal of a next frame is supplied.

Figure 6:
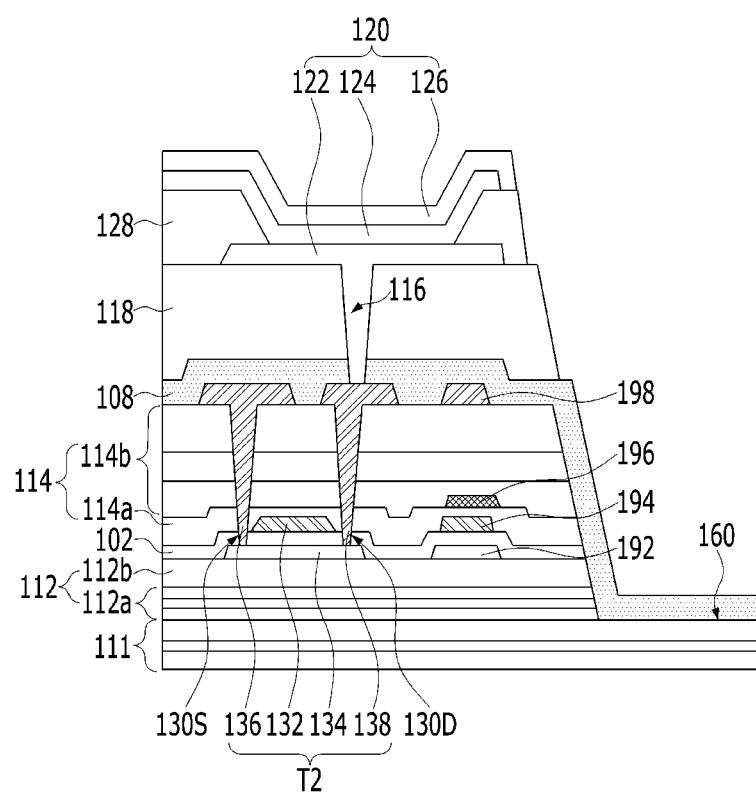
FIG. 6 is a cross-sectional view illustrating the driving transistor illustrated in FIG. 5 in detail according to an embodiment of the present disclosure.

To this end, the driving transistor T2, as illustrated in FIGS. 5 and 6, includes a semiconductor layer 134 disposed on a buffer layer 112, a gate electrode 132 overlapping the semiconductor layer 134 with a gate insulation film 102 interposed therebetween, and source and drain electrodes 136 and 138 formed on an interlayer insulation film 114 so as to come into contact with the semiconductor layer 134.

The semiconductor layer 134 is formed of at least one of an amorphous semiconductor material, a polycrystalline semiconductor material, and an oxide semiconductor material. The semiconductor layer 134 includes a channel region, a source region, and a drain region. The channel region is formed between the source and drain electrodes 136 and 138 while overlapping the gate electrode 132 with the gate insulation film 102 interposed therebetween. The source region is electrically connected to the source electrode 136 through a source contact hole 130S that penetrates the gate insulation film 102 and the interlayer insulation film 114. The drain region is electrically connected to the drain electrode 138 through a drain contact hole 130D that penetrates the gate insulation film 102 and the interlayer insulation film 114.

As illustrated in FIG. 6, the buffer layer 112, which is disposed between the semiconductor layer 134 and the substrate 111, includes a multi-buffer layer 112a and an active buffer layer 112b. The multi-buffer layer 112a impedes diffusion of moisture and/or oxygen permeating the substrate 111. The active buffer layer 112b functions to protect the semiconductor layer 134 and to block a variety of defect-causing factors from the substrate 111. At least one of the multi-buffer layer 112a, the active buffer layer 112b and the substrate 111 is formed in a multi-layer structure. For example, the substrate 111 includes first and second sublayers, which are formed of a plastic material, and a third sublayer, which is disposed between the first and second sublayers and is formed of an inorganic insulation material.

The uppermost layer of the multi-buffer layer 112a, which is in contact with the active buffer layer 112b, is formed of a material, which has etching characteristics different from the materials of the remaining layers of the multi-buffer layer 112a, the active buffer layer 112b, the gate insulation film 102 and the interlayer insulation film 114. The uppermost layer of the multi-buffer layer 112a, which is in contact with the active buffer layer 112b, is formed of one of SiNx and SiOx, and the remaining layers of the multi-buffer layer 112a, the active buffer layer 112b, the gate insulation film 102 and the interlayer insulation film 114 are formed of the other one of SiNx and SiOx. For example, the uppermost layer of the multi-buffer layer 112a, which is in contact with the active buffer layer 112b, is formed of SiNx, and the remaining layers of the multi-buffer layer 112a, the active buffer layer 112b, the gate insulation film 102 and the interlayer insulation film 114 are formed of SiOx.

The gate electrode 132 may be a single layer or multiple layers formed of any one selected from among molybdenum (Mo), aluminum (Al), chrome (Cr), gold (Au), titanium (Ti), nickel (Ni), neodymium (Nd), and copper (Cu), or an alloy thereof, without being limited thereto.

The gate electrode 132 overlaps the channel region of the semiconductor layer 134 with the gate insulation film 102 interposed therebetween. Here, as illustrated in FIG. 5, the gate insulation film 102 is formed to have the same line width as the gate electrode 132 so as to expose the side surface of the semiconductor layer 134. Alternatively, as illustrated in FIG. 6, the gate insulation film 102 is formed to have a larger line width than the gate electrode 132 so as to cover the side surface of the semiconductor layer 134.

Each of the source and drain electrodes 136 and 138 may be a single layer or multiple layers formed of any one selected from among molybdenum (Mo), aluminum (Al), chrome (Cr), gold (Au), titanium (Ti), nickel (Ni), neodymium (Nd), and copper (Cu), or an alloy thereof, without being limited thereto. The source electrode 136 is connected to the source region of the semiconductor layer 134, which is exposed through the source contact hole 130S that penetrates the gate insulation film 102 and the interlayer insulation film 114 or penetrates only the interlayer insulation film 114. The drain electrode 138 faces the source electrode 136 and is connected to the drain region of the semiconductor layer 134 through the drain contact hole 130D that penetrates the gate insulation film 102 and the interlayer insulation film 114 or penetrates only the interlayer insulation film 114. Here, the interlayer insulation film 114 is formed in a single-layer structure, as illustrated in FIG. 5, or includes a lower interlayer insulation film 114a and an upper interlayer insulation film 114b, as illustrated in FIG. 6. The lower interlayer insulation film 114a is formed to have a smaller thickness than the upper interlayer insulation film 114b. For example, the lower interlayer insulation film 114a may be formed in a single-layer structure, and the upper interlayer insulation film 114b may be formed in a single-layer or multi-layer structure.

As illustrated in FIG. 6, the storage capacitor Cst includes at least two storage electrodes of first to fourth storage electrodes 192, 194, 196 and 198. The first storage electrode 192 is formed of the same material as the semiconductor layer 134 on the buffer layer 112. The second storage electrode 194 is formed of the same material as the gate electrode 132 on the gate insulation film 102. The third storage electrode 196 is formed of the same material as one of the gate electrode 132 and the source and drain electrodes 136 and 138 on the lower interlayer insulation film 114a. The fourth storage electrode 198 is formed of the same material as the source and drain electrodes 136 and 138 on the upper interlayer insulation film 114b.

The light-emitting element 120 includes an anode 122, at least one light-emitting stack 124 formed on the anode 122, and a cathode 126 formed on the light-emitting stack 124.

The anode 122 is electrically connected to the drain electrode 138 of the driving transistor T2, which is exposed through a pixel contact hole 116 that penetrates a passivation layer 108 and a planarization layer 118, which are disposed on the driving transistor T2. The anode 122 of each subpixel is formed so as to be exposed by a bank 128. The bank 128 may be formed of an opaque material (e.g. a black material) in order to prevent optical interference between adjacent subpixels. Here, the bank 128 includes a light-blocking material formed of at least one selected from among a color pigment, organic black and carbon materials.

The light-emitting stack 124 is formed on the anode 122 in a light-emitting area that is defined by the bank 128. The light-emitting stack 124 is formed by stacking a hole-related layer, an organic emission layer, and an electron-related layer on the anode 122 in that order or in the reverse order. In addition, the light-emitting stack 124 may include first and second light-emitting stacks, which face each other with a charge generation layer interposed therebetween. In this case, the organic emission layer of any one of the first and second light-emitting stacks generates blue light, and the organic emission layer of the other one of the first and second light-emitting stacks generates yellow-green light, whereby white light is generated via the first and second light-emitting stacks. Since the white light generated in the light-emitting stack 124 is incident on a color filter located above or under the light-emitting stack 124, a color image may be realized. In addition, colored light corresponding to each subpixel may be generated in each light-emitting stack 124 to realize a color image without a separate color filter. That is, the light-emitting stack 124 of the red (R) subpixel may generate red light, the light-emitting stack 124 of the green (G) subpixel may generate green light, and the light-emitting stack 124 of the blue (B) subpixel may generate blue light.

The cathode 126 is formed so as to face the anode 122 with the light-emitting stack 124 interposed therebetween and is connected to a low-voltage (VSS) supply line.

The encapsulation layer 140 prevents external moisture or oxygen from entering the light-emitting element 120, which is vulnerable to the external moisture or oxygen.

To this end, the encapsulation layer 140 includes at least two inorganic encapsulation layers 142 and 146 and at least one organic encapsulation layer 144. In the present disclosure, the structure of the encapsulation layer 140 in which the first inorganic encapsulation layer 142, the organic encapsulation layer 144 and the second inorganic encapsulation layer 146 are stacked in that order will be described by way of example.

The first inorganic encapsulation layer 142 is formed on the substrate 111, on which the cathode 126 has been formed. The second inorganic encapsulation layer 146 is formed on the substrate 111, on which the organic encapsulation layer 144 has been formed, so as to cover the upper surface, the lower surface and the side surface of the organic encapsulation layer 144 together with the first inorganic encapsulation layer 142.

The first and second inorganic encapsulation layers 142 and 146 minimize or prevent the permeation of external moisture or oxygen into the light-emitting stack 124. Each of the first and second inorganic encapsulation layers 142 and 146 is formed of an inorganic insulation material that is capable of being deposited at a low temperature, such as silicon nitride (SiNx), silicon oxide (SiOx), silicon oxide nitride (SiON), or aluminum oxide ($Al_2O_3$). Thus, since the first and second inorganic encapsulation layers 142 and 146 are deposited in a low-temperature atmosphere, it is possible to prevent damage to the light-emitting stack 124, which is vulnerable to a high-temperature atmosphere, during the process of depositing the first and second inorganic encapsulation layers 142 and 146.

The first and second inorganic encapsulation layers 142 and 146 are formed to have larger thicknesses than the passivation layer 108 and thus are vulnerable to external shocks. Thus, the first and second inorganic encapsulation layers 142 and 146 are formed so as not to be disposed in the bending area BA.

The organic encapsulation layer 144 serves to dampen the stress between the respective layers due to bending of the organic light-emitting display device and to increase planarization performance. The organic encapsulation layer 144 is formed on the substrate 111, on which the first inorganic encapsulation layer 142 has been formed, using a non-photosensitive organic insulation material, such as PCL, acrylic resin, epoxy resin, polyimide, polyethylene or silicon oxycarbide (SiOC), or using a photosensitive organic insulation material such as photoacryl. The organic encapsulation layer 144 is disposed in the active area AA, other than the non-active area NA. Here, a dam 106 is disposed on the passivation layer 108 in order to prevent the organic encapsulation layer 144 from spreading to the non-active area NA.

A touch-sensing line 154 and a touch-driving line 152 are disposed so as to intersect each other in the active area AA of the encapsulation layer 140, with the touch insulation film 156 interposed therebetween. A mutual capacitance array Cm is formed at a point at which the touch-sensing line 154 and the touch-driving line 152 intersect each other. Thus, the mutual capacitance array Cm charges an electric charge using a touch-driving pulse supplied to the touch-driving line 152 and discharges the electric charge to the touch-sensing line 154, thereby serving as a touch sensor.

The touch-driving line 152 includes a plurality of first touch electrodes 152e and first bridges 152b electrically connecting the first touch electrodes 152e to each other.

The first touch electrodes 152e are spaced apart from each other at regular intervals in the Y-axis direction, which is the first direction, on the touch insulation film 156. Each of the first touch electrodes 152e is electrically connected to an adjacent first touch electrode 152e via the first bridge 152b.

The first bridge 152b is disposed on the touch insulation film 156 in the same plane as the first touch electrode 152e and is electrically connected to the first touch electrode 152e without a separate contact hole. Since the first bridge 152b is disposed so as to overlap the bank 128, it is possible to prevent the aperture ratio from being lowered by the first bridge 152b.

The touch-sensing line 154 includes a plurality of second touch electrodes 154e and second bridges 154b electrically connecting the second touch electrodes 154e to each other.

The second touch electrodes 154e are spaced apart from each other at regular intervals in the X-axis direction, which is the second direction, on the touch insulation film 156. Each of the second touch electrodes 154e is electrically connected to an adjacent second touch electrode 154e via the second bridge 154b.

The second bridge 154b is formed on the second inorganic encapsulation layer 146 and is electrically connected to the second touch electrode 154e through a touch contact hole 150 that penetrates the touch insulation film 156. Like the first bridge 152b, the second bridge 154b is disposed so as to overlap the bank 128, thereby preventing the aperture ratio from being lowered by the second bridge 154b.

It is illustrated by way of example in FIG. 5 that the second bridge 154b is in contact with the second inorganic encapsulation layer 146 on the second inorganic encapsulation layer 146, which is disposed at the uppermost side of the encapsulation layer. Alternatively, at least one of the first and second touch electrodes 152e and 154e and the first bridge 152b may be in contact with the second inorganic encapsulation layer 146 on the second inorganic encapsulation layer 146, and the second bridge 154b may be disposed on the touch insulation film 156.

The non-active area NA includes the bending area BA for bending or folding the substrate 111.

As illustrated in FIGS. 4 and 5, a second routing line 164 and a display link 174 are disposed in the bending area BA across the bending area BA. In addition, the crack prevention layer 188 and at least one opening 160, 168 and 178 are disposed in the bending area BA so that the bending area BA is easily bent.

The crack prevention layer 188 is formed of an organic insulation material having a higher strain rate and higher impact resistance than the inorganic insulation film. For example, since the crack prevention layer 188 is formed together with at least one of the planarization layer 118 and the bank 128, the crack prevention layer 188 is disposed in the same plane as at least one of the planarization layer 118 and the bank 128 and is formed of the same material. The crack prevention layer 188, which is formed of an organic insulation material, has a higher strain rate than the inorganic insulation material and thus alleviates bending stress caused by bending of the substrate 111. Accordingly, the crack prevention layer 188 is capable of preventing cracking of the bending area BA, thus preventing cracks from spreading to the active area AA.

The openings 160, 168, and 178 are formed by removing the inorganic films, which have higher hardness than the organic films and thus easily crack due to bending stress.

The first opening 160 is formed by removing the lower insulation film, which includes the buffer layer 112, the gate insulation film 102 and the interlayer insulation film 114, which are disposed under the passivation layer 108 of the non-active area NA. Since the first opening 160 is simultaneously formed through the same mask process as the source and drain contact holes 130S and 130D, the structure and the processing are simplified.

The second opening 168 is formed by removing the inorganic film, which includes at least one of the conductive film and the inorganic insulation film, which is disposed on the crack prevention layer 188 overlapping the second routing line 164. A first touch routing line 162 and a touch pad 170 are spaced apart from each other, with the second opening 168 therebetween.

The third opening 178 is formed by removing the passivation layer overlapping the crack prevention layer 188. The passivation layer 108 is removed to expose the second routing line 164 and the display link 174 in the bending area BA due to the third opening 178. Since the third opening 178 is simultaneously formed through the same mask process as the pixel contact hole 116, the structure and the processing are simplified.

In the present disclosure, it is possible to prevent cracking using the openings 160, 168 and 178 and the crack prevention layer 188 disposed in the bending area BA. Accordingly, the present disclosure is capable of preventing cracks from spreading to the active area AA, thus preventing the occurrence of defects in the lines and malfunction of the device.

A display pad 180, which is connected to at least one of the data line DL, the scan line SL, the low-voltage (VSS) supply line and the high-voltage (VDD) supply line, and the touch pad 170 are disposed in the non-active area NA. The display pad 180 and the touch pad 170 may be disposed in the non-active area NA disposed on at least one of one side and the opposite side of the substrate 111, or may be disposed in different non-active areas NA from each other.

The touch pad 170 and the display pad 180 are not limited to the structure illustrated in FIG. 4, but may be variously changed depending on the design choices made for the display device.

The touch pad 170 and the display pad 180 are formed to be exposed by the touch protective film 158. Thus, the touch pad 170 is connected to a signal transmission film, on which a touch-driving circuit (not illustrated) is installed, and the display pad 180 is connected to a signal transmission film, on which at least one of the scan driver 202 and the data driver 204 illustrated in FIG. 1 is installed. The touch-driving circuit may be installed in any one of the data driver 204 and the timing controller.

The touch protective film 158 is formed to cover the touch electrode 152e and 154e, thus preventing the touch sensor from corroding due to external moisture or the like. The touch protective film 158 is formed in a film or thin-film configuration using an organic insulation material such as epoxy or acryl, or is formed of an inorganic insulation material such as SiNx or SiOx, or is formed of a polarizing film.

The touch pad 170 is formed of the same material as the first touch routing line 162 and is disposed on the touch insulation film 156. Each touch pad 170 is electrically connected to a respective one of the touch electrodes 152e and 154e via the first and second routing lines 162 and 164. The touch pad 170, the first routing line 162 and the second routing line 164, the display link 174 and the display pad 180 overlap the passivation layer 108 in the non-active area NA.

The first routing line 162 extends from the touch electrodes 152e and 154e, and is formed along the side surface of the encapsulation layer 140. Here, the first routing line 162 is disposed across at least one dam 106. The first routing line 162 is formed of the same material as the touch electrodes 152e and 154e and is disposed on the touch insulation film 156.

The second routing line 164 is formed of the same material as at least one of the gate electrode 132 and the source and drain electrodes 136 and 138 and is disposed on the substrate 111 exposed by the first opening 160. The second routing line 164 is exposed through a routing contact hole 166a, which penetrates the passivation layer 108 and the touch insulation film 156, and is connected to the first routing line 162. The second routing line 164 is exposed through a touch pad contact hole 166b, which penetrates the passivation layer 108 and the touch insulation film 156, and is connected to the touch pad 170.

The display pad 180 is formed of the same material as the touch pad 170 and is disposed on the touch insulation film 156. Each display pad 180 is connected to the signal line via the display link 174, which extends from at least one signal line of the data line DL, the scan line SL, the low-voltage (VSS) supply line and the high-voltage (VDD) supply line.

The display link 174 is formed of the same material as at least one of the gate electrode 132 and the source and drain electrodes 136 and 138 and is disposed on the substrate 111 exposed by the first opening 160. The display link 174 is exposed through the display pad contact hole 176, which penetrates the passivation layer 108 and the touch insulation film 156, and is connected to the display pad 180.

Figure 7A:
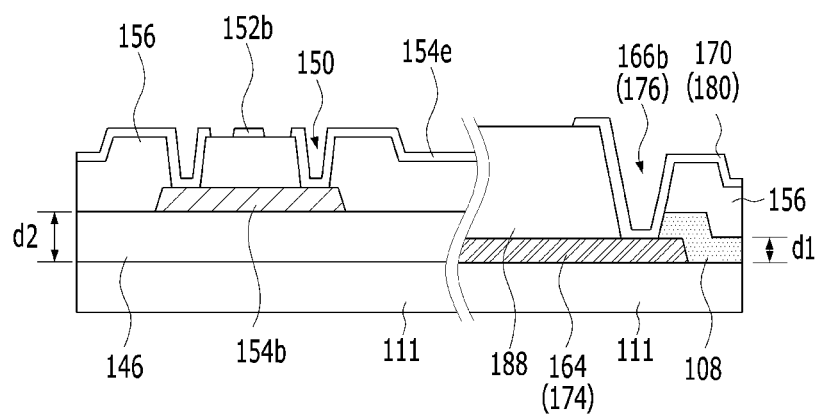
FIG. 7A is a cross-sectional view illustrating an embodiment of the present disclosure in which a passivation layer is disposed under a touch pad and a display pad.

Each of the display pad contact hole 176 and the touch pad contact hole 166b is formed through the same mask process as the touch contact hole 150. That is, during the process of etching the touch insulation film 156 on the second bridge 154b, the passivation layer 108 and the touch insulation film 156, which are disposed on the second touch routing line 164 and the display link 174, are also etched, thereby forming the touch contact hole 150, the display pad contact hole 176 and the touch pad contact hole 166b together. Here, the passivation layer 108, as illustrated in FIG. 7A, is formed to have a smaller thickness d1 than a thickness d2 of any one of the first and second inorganic encapsulation layers 142 and 146 and the touch insulation film 156. Thus, during the process of etching the passivation layer 108 for forming the display pad contact hole 176 and the touch pad contact hole 166b, it is possible to prevent damage to the second bridge 154b exposed by the touch contact hole 150.

Figure 7B:
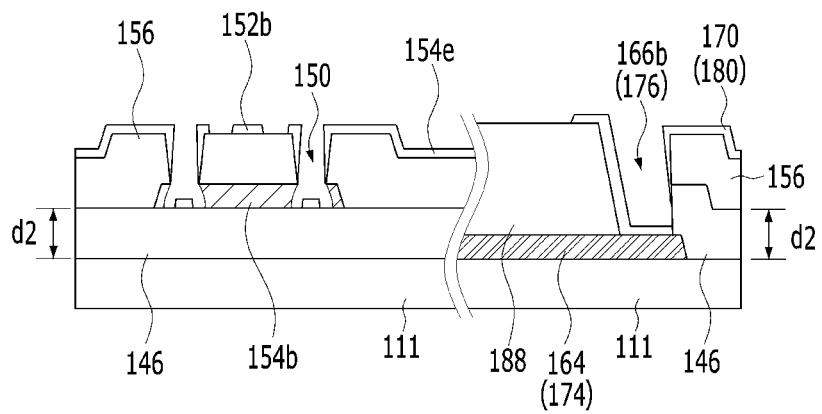
FIG. 7B is a cross-sectional view illustrating a comparative example in which an inorganic encapsulation layer is disposed under a touch pad and a display pad.

Meanwhile, in a comparative example illustrated in FIG. 7B, any one such as the inorganic encapsulation layer 146 of the first and second inorganic encapsulation layers 142 and 146, which has a thickness d2 larger than the thickness d1 of the passivation layer 108, and the touch insulation film 156 are disposed on the second touch routing line 164 and the display link 174. In this case, during the formation of the display pad contact hole 176 and the touch pad contact hole 166b, the etching time of the inorganic encapsulation layer 146 is longer than the etching time of the passivation layer 108 according to the embodiment illustrated in FIG. 7A. Thus, during the process of etching the inorganic encapsulation layer 146 for forming the display pad contact hole 176 and the touch pad contact hole 166b, as illustrated in FIG. 7B, the second bridge 154b exposed by the touch contact hole 150 is damaged.

Since the touch insulation film 156 according to the embodiment illustrated in FIG. 7A is disposed on the organic emission layer of the light-emitting stack 124, the touch insulation film 156 is formed through a low-temperature deposition process in order to prevent damage to the organic emission layer, which is vulnerable to a high-temperature atmosphere. Since the passivation layer 108 is disposed under the organic emission layer of the light-emitting stack 124, the passivation layer 108 may be formed through a high-temperature deposition process. In this case, during the formation of the display pad contact hole 176 and the touch pad contact hole 166b, the etching speed of the touch insulation film 156 formed through a low-temperature deposition process is higher than the etching speed of the passivation layer 108 formed through a high-temperature deposition process, and thus the touch insulation film 156 is more etched than the passivation layer 108. Thus, the passivation layer 108 and the touch insulation film 156, which are exposed by the display pad contact hole 176 and the touch pad contact hole 166b, have forwardly-tapered side surfaces. Thus, it is possible to improve the step coverage of the touch pad 170 and the display pad 180, which are disposed on the passivation layer 108 and the touch insulation film 156 having the forwardly-tapered side surfaces.

Meanwhile, in the comparative example illustrated in FIG. 7B, since the inorganic encapsulation layer 146 is disposed on the organic emission layer of the light-emitting stack 124, the inorganic encapsulation layer 146 is formed through a low-temperature deposition process in order to prevent damage to the organic emission layer, which is vulnerable to a high-temperature atmosphere. In this case, during the formation of the display pad contact hole 176 and the touch pad contact hole 166b, the inorganic encapsulation layer 146 and the touch insulation film 156, which are exposed by the display pad contact hole 176 and the touch pad contact hole 166b, have reverse-tapered side surfaces. The step coverage of the touch pad 170 and the display pad 180 in the comparative example, which are disposed on the inorganic encapsulation layer 146 and the touch insulation film 156 having the reverse-tapered side surfaces, is deteriorated compared to the step coverage of the touch pad 170 and the display pad 180 according to the embodiment.

In the present disclosure, during the formation of the second bridge 154b, the second touch routing line 164 and the display link 174, which are formed of the same material as the second bridge 154b, are protected by the passivation layer 108, which has a smaller thickness than the inorganic encapsulation layers 142 and 146. Thus, in the present disclosure, since a separate touch buffer layer for protecting the second touch routing line 164 and the display link 174 is not necessary, the touch buffer layer, which is disposed between the encapsulation layer 140 and the touch sensor, may be eliminated, whereby the structure may be simplified.

In addition, in the present disclosure, the passivation layer 108, which has a smaller thickness than the inorganic encapsulation layers 142 and 146, is disposed on the second touch routing line 164 and the display link 174. Thus, in the present disclosure, during the process of etching the passivation layer 108 to form the display pad contact hole 176 and the touch pad contact hole 166b, it is possible to prevent damage to the second bridge 154b exposed by the touch contact hole 150.

Figure 8:
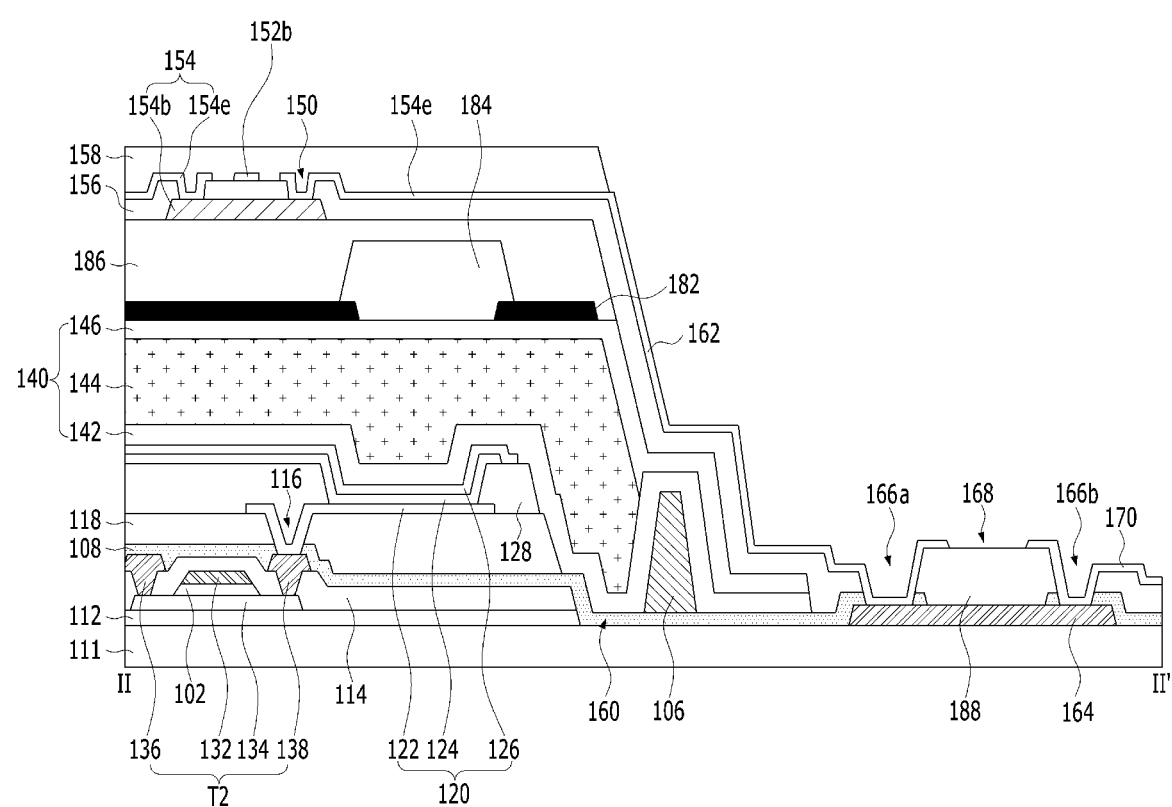
FIG. 8 is a cross-sectional view illustrating an organic light-emitting display device having a touch sensor according to another embodiment of the present disclosure.

FIG. 8 is a cross-sectional view illustrating an organic light-emitting display device having a touch sensor according to a second embodiment of the present disclosure.

The organic light-emitting display device having a touch sensor illustrated in FIG. 8 has the same constituent components as the organic light-emitting display device illustrated in FIG. 5, except that a color filter array is further provided. A detailed explanation of the same constituent components will be omitted.

The color filter array includes color filters 184 and black matrixes 182 disposed on the second inorganic encapsulation layer 146 of the encapsulation layer 140. The color filters 184 are formed between each of the touch-sensing lines 154 and the touch-driving lines 152 and the light-emitting element 120. The spacing distance between each of the touch-sensing lines 154 and the touch-driving lines 152 and the light-emitting element 120 is increased by the color filters 184. Thus, the capacity of a parasitic capacitor formed between each of the touch-sensing lines 154 and the touch-driving lines 152 and the light-emitting element 120 may be minimized, thus preventing mutual interaction due to coupling between each of the touch-sensing lines 154 and the touch-driving lines 152 and the light-emitting element 120. In addition, the color filters 184 are capable of preventing liquid chemicals (developer, etchant or the like), which are used for the manufacture of the touch-sensing lines 154 and the touch-driving lines 152, or external moisture from permeating the light-emitting stack 124. Thus, the color filters 184 are capable of preventing damage to the light-emitting stack 124, which is vulnerable to liquid chemical or moisture.

Each of the black matrixes 182 is disposed between adjacent color filters 184. The black matrixes 182 serve to divide the subpixel areas from each other and to prevent optical interference and light leakage between adjacent subpixel areas. The black matrixes 182 are formed of a black insulation material having high resistance, or are formed such that at least two of red (R), green (G) and blue (B) color filters 184 are stacked.

A touch planarization film 186 is disposed on the substrate 111, on which the color filters 184 and the black matrixes 182 have been formed. The substrate 111, on which the color filters 184 and the black matrixes 182 have been formed, is flattened by the touch planarization film 186.

It is illustrated by way of example in FIG. 8 that the touch electrodes 152e and 154e are disposed on the color filters 184. Alternatively, the color filters 184 may be disposed on the touch electrodes 152e and 154e.

Further, it is illustrated by way of example in FIG. 8 that the color filters 184 and the black matrixes 182 are in contact with each other. Alternatively, the color filters 184 and the black matrixes 182 may be spaced apart from each other. For example, the color filters 184 may be disposed between the encapsulation layer 140 and the touch sensor, and the black matrixes 182 may be disposed on the touch sensor.

FIGS. 9A to 9F are cross-sectional views illustrating a method of manufacturing the organic light-emitting display device having a touch sensor illustrated in FIG. 5 according to an embodiment of the present disclosure.

Figure 9A:
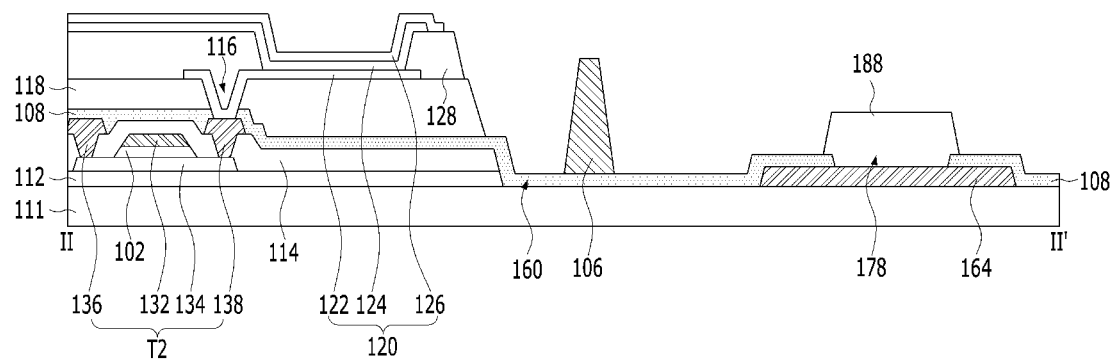
FIGS. 9A to 9F are cross-sectional views illustrating a method of manufacturing the organic light-emitting display device having a touch sensor illustrated in FIG. 5 according to an embodiment of the present disclosure.
Figure 9A:
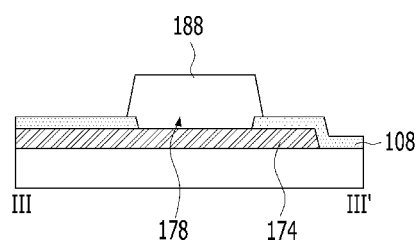

Referring to FIG. 9A, the switching transistor T1, the driving transistor T2, the second touch routing line 164, the display link 174 and the light-emitting element 120 are formed on the substrate 111.

Specifically, the buffer layer 112 is formed by stacking SiOx or SiNx and the inorganic insulation films a multiple number of times on the substrate 111. Subsequently, amorphous silicon, polycrystalline silicon or oxide silicon is deposited on the buffer layer 112 and is patterned, thereby forming the semiconductor layer 134. An inorganic insulation material such as SiNx or SiOx is deposited on the entire surface of the substrate 111, on which the semiconductor layer 134 has been formed, thereby forming the gate insulation film 102. A first conductive layer is deposited on the entire surface of the gate insulation film 102 and is patterned, thereby forming the gate electrode 132. An inorganic insulation material such as SiNx or SiOx is deposited on the entire surface of the substrate 111, on which the gate electrode 132 has been formed, thereby forming the interlayer insulation film 114, and the interlayer insulation film 114 and the buffer layer 112 are patterned, thereby forming the source and drain contact holes 130S and 130D and the first opening 160. A second conductive layer is deposited on the entire surface of the substrate 111, in which the source and drain contact holes 130S and 130D and the first opening 160 have been formed, and is patterned, thereby forming the source and drain electrodes 136 and 138, the second touch routing line 164, and the display link 174. Subsequently, an inorganic insulation material such as SiNx or SiOx is deposited, thereby forming the passivation layer 108. Subsequently, the passivation layer 108 is patterned, thereby removing the passivation layer 108 of the bending area BA and forming the pixel contact hole 116 exposing the drain electrode 138 of the driving transistor T2. An organic insulation material is coated on the substrate 111, on which the passivation layer 108 has been formed, and is patterned, thereby forming the planarization layer 118 having therein the pixel contact hole 116 and the crack prevention layer 188 disposed in the bending area BA.

A third conductive layer is deposited on the entire surface of the substrate 111, on which the planarization layer 118 and the crack prevention layer 188 have been formed, and is patterned, thereby forming the anode 122. A photosensitive organic film is coated on the substrate 111, on which the anode 122 has been formed, and is patterned, thereby forming the bank 128 and at least one dam 106. Subsequently, the light-emitting stack 124 and the cathode 126 are sequentially formed in the active area AA, other than the non-active area NA, through a deposition process using a shadow mask.

Figure 9B:
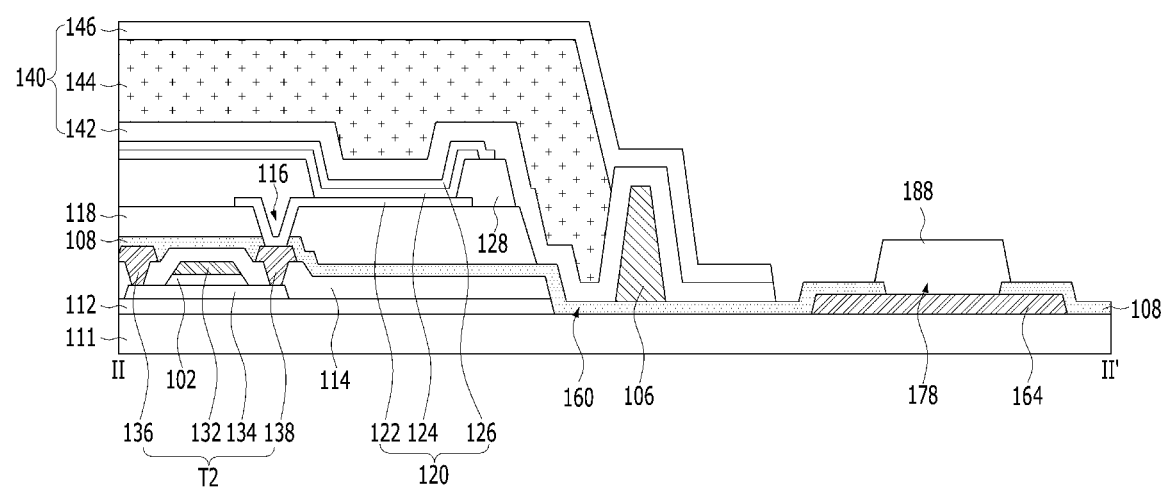
Figure 9B:
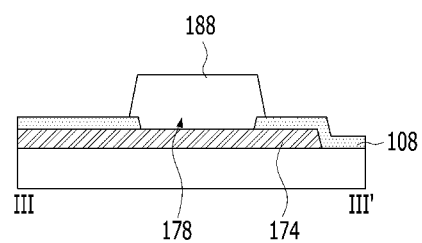

Referring to FIG. 9B, the encapsulation layer 140 is formed on the substrate 111, on which the light-emitting element 120 has been formed.

Specifically, the first inorganic encapsulation film 142 is formed on the substrate 111, on which the light-emitting element 120 has been formed, through a deposition method, such as a chemical vapor deposition (CVD) method, a low-pressure chemical vapor deposition (LPCVD) method or a plasma-enhanced chemical vapor deposition (PECVD) method. Here, the first inorganic encapsulation film 142 is formed of an inorganic insulation material such as SiOx, SiNx or SiON. Subsequently, a photosensitive or non-photosensitive first organic insulation material is coated on the substrate 111, on which the first inorganic encapsulation film 142 has been formed, thereby forming the organic encapsulation film 144. Here, the organic encapsulation film 144 is formed of an organic insulation material, such as PCL, acrylic resin, epoxy resin, polyimide, polyethylene or silicon oxycarbide (SiOC). Subsequently, an inorganic insulation material is deposited on the substrate 111, on which the organic encapsulation film 144 has been formed, thereby forming the second inorganic encapsulation layer 146.

Figure 9C:
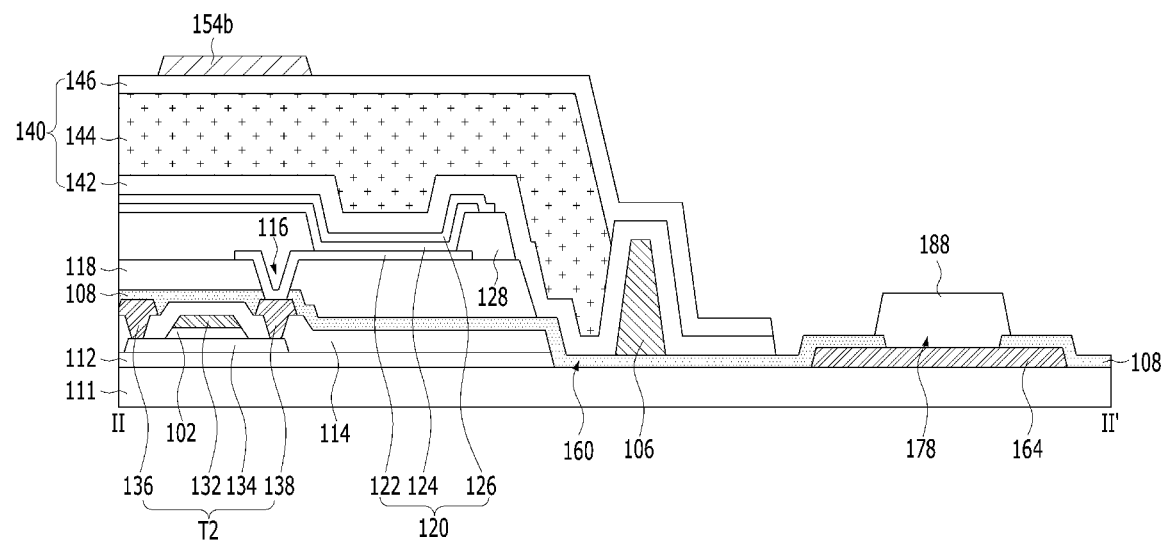
Figure 9C:
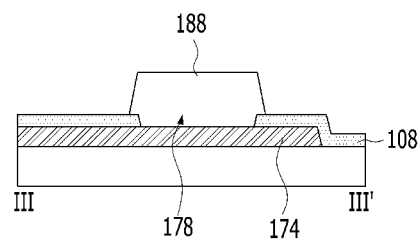

Referring to FIG. 9C, the second bridge 154b is formed on the uppermost layer (e.g. the second inorganic encapsulation layer 146) of the encapsulation layer 140.

Specifically, an opaque conductive layer is deposited on the entire surface of the substrate 111, on which the encapsulation layer 140 has been formed, through a deposition process using sputtering at a room temperature. Subsequently, the opaque conductive layer is patterned through a photolithography process and an etching process, thereby forming the second bridge 154b. Here, the opaque conductive layer is formed of a metal material, such as Al, Ti, Cu, Mo, Ta, or MoTi, and is formed in a single-layer or multi-layer structure. Here, the second touch routing line 164 and the display link 174, which are formed of the same material as the second bridge 154b, are not exposed to the outside, but are protected by the passivation layer 108 and the crack prevention layer 188. Thus, during the process of etching the second bridge 154b, it is possible to prevent damage to the second touch routing line 164 and the display link 174.

Figure 9D:
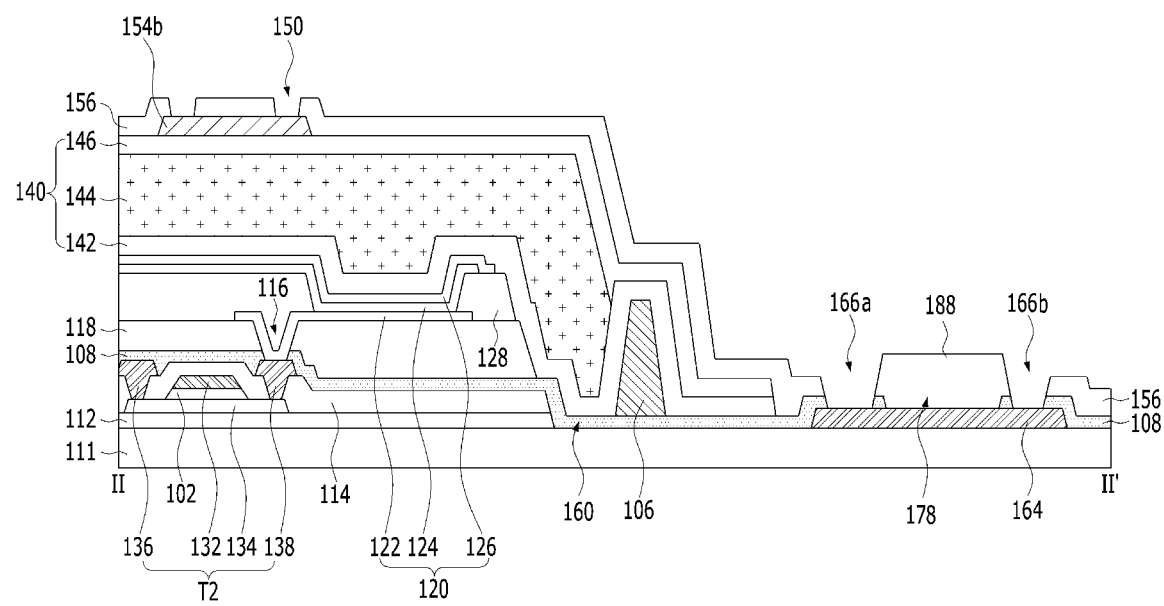
Figure 9D:
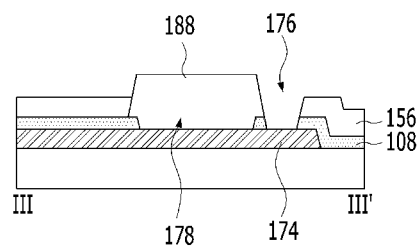

Referring to FIG. 9D, the touch insulation film 156 is formed on the substrate 111, on which the second bridge 154b has been formed.

Specifically, an inorganic insulation material is deposited on the substrate 111, on which the second bridge 154b has been formed, thereby forming the touch insulation film 156. Subsequently, the touch insulation film 156 and the passivation layer 108 of the non-active area NA are patterned through a photolithography process and an etching process, thereby forming the routing contact hole 166a, the touch pad contact hole 166b and the display pad contact hole 176. At the same time, the touch insulation film 156 of the active area AA is patterned, thereby forming the touch contact hole 150.

Here, since the passivation layer 108 of the non-active area NA is formed to have a smaller thickness than the inorganic encapsulation layers 142 and 146, it is possible to prevent damage to the second bridge 154b exposed by the touch contact hole 150 during the formation of the touch pad contact hole 166b and the display pad contact hole 176.

Figure 9E:
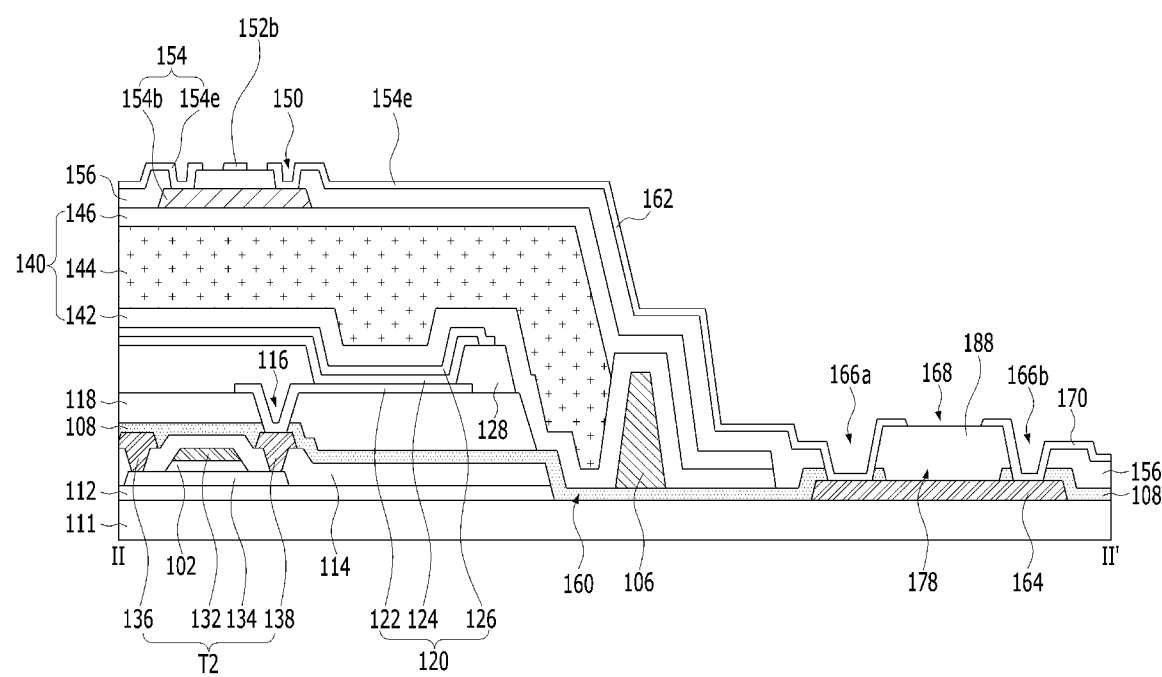
Figure 9E:
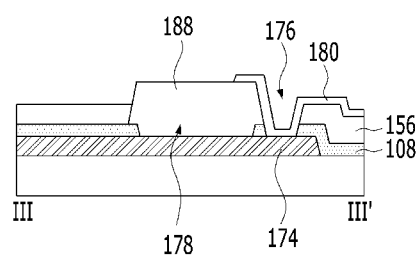

Referring to FIG. 9E, the first touch electrode 152e and the second touch electrode 154e, the first bridge 152b, the first touch routing line 162, the touch pad 170, and the display pad 180 are formed on the substrate 111, in which the touch contact hole 150 has been formed.

Specifically, a transparent conductive layer, such as ITO, IZO, or IGZO, is deposited on the entire surface of the substrate 111, in which the touch contact hole 150 has been formed, and is patterned through a photolithography process and an etching process. Thus, the first touch electrode 152e and the second touch electrode 154e, the first bridge 152b, the first touch routing line 162, the touch pad 170, and the display pad 180 are formed. Here, the first touch routing line 162 and the touch pad 170, which are disposed on the crack prevention layer 188, are spaced apart from each other, with the second opening 168 therebetween.

Figure 9F:
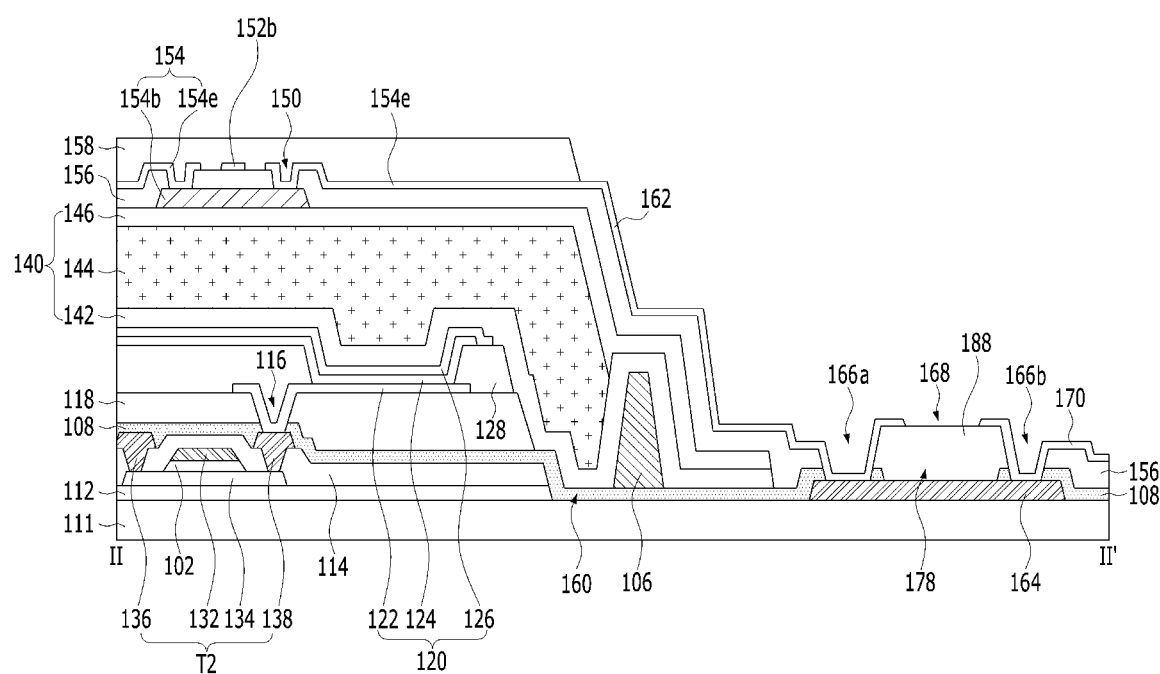
Figure 9F:
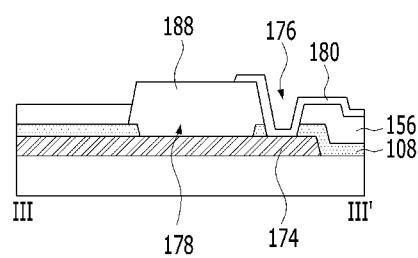

Referring to FIG. 9F, the touch protective film 158 is formed on the substrate 111, on which the first and second touch electrodes 152e and 154e, the first bridge 152b, the first touch routing line 162, the touch pad 170, and the display pad 180 have been formed.

Specifically, an inorganic insulation material or an organic insulation material is formed on the entire surface of the substrate 111, on which the first and second touch electrodes 152e and 154e, the first bridge 152b, the first touch routing line 162, the touch pad 170 and the display pad 180 have been formed. Subsequently, the inorganic insulation material or the organic insulation material is patterned through a photolithography process and an etching process, thereby forming the touch protective film 158. The touch protective film 158 is formed in a film or thin-film configuration using an organic insulation material such as epoxy or acryl, or is formed of an inorganic insulation material such as SiNx or SiOx.

In the present disclosure, during the formation of the second bridge 154b, the second touch routing line 164 and the display link 174, which are formed of the same material as the second bridge 154b, are protected by the passivation layer 108, which has a smaller thickness than the inorganic encapsulation layers 142 and 146. Thus, in the present disclosure, since a separate touch buffer layer for protecting the second touch routing line 164 and the display link 174 is not necessary, the touch buffer layer, which is disposed between the encapsulation layer 140 and the touch sensor, may be eliminated, whereby the structure may be simplified. Of course, the touch buffer layer can be disposed between the encapsulation layer 140 and the touch sensor, if necessary.

In addition, in the present disclosure, the passivation layer 108, which has a smaller thickness than the inorganic encapsulation layers 142 and 146, is disposed on the second touch routing line 164 and the display link 174. Thus, in the present disclosure, during the process of etching the passivation layer 108 to form the display pad contact hole 176 and the touch pad contact hole 166b, it is possible to prevent damage to the second bridge 154b exposed by the touch contact hole 150.

In the present disclosure, the display device having a bending area has been described by way of example, but the present disclosure is also applicable to a display device having no bending area.

Figure 10A:
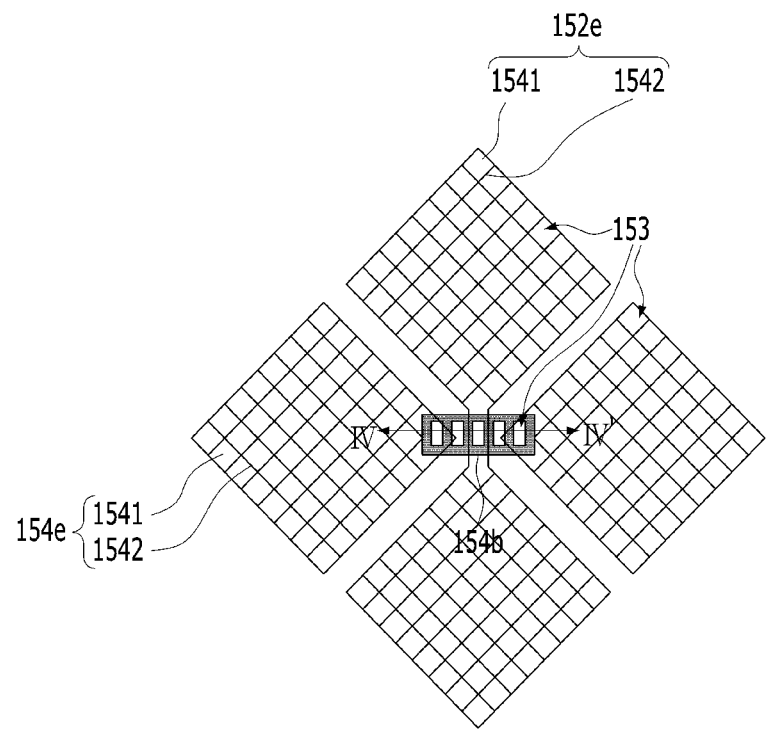
FIGS. 10A and 10B are a plan view and a cross-sectional view, respectively, illustrating another example of the first and second touch electrodes illustrated in FIG. 5.
Figure 10B:
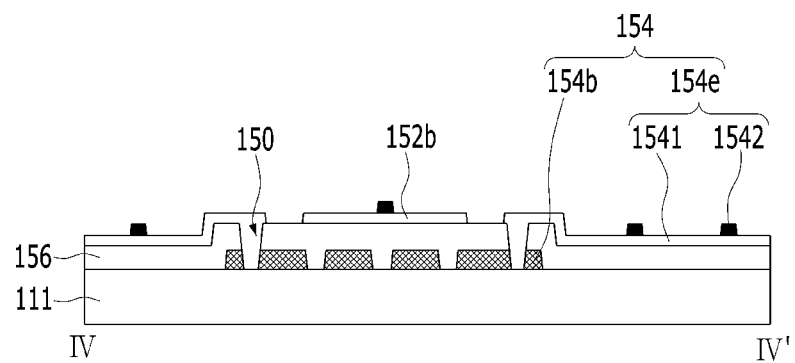

Moreover, in the present disclosure, the configuration in which the first and second touch electrodes 152e and 154e and the first and second bridges 152b and 154b are formed to have a plate shape, as illustrated in FIG. 4, has been described by way of example, but the first and second touch electrodes 152e and 154e and the first and second bridges 152b and 154b may be formed to have a mesh shape, as illustrated in FIGS. 10A and 10B. That is, at least one of the first touch electrode 152e and the second touch electrode 154e and at least one of the first bridge 152b and the second bridge 154b may be formed of a transparent conductive film 1541, such as ITO or IZO, and a mesh metal film 1542 disposed above or under the transparent conductive film 1541 and having a mesh shape. Alternatively, at least one of the first touch electrode 152e and the second touch electrode 154e and the first and second bridges 152b and 154b may be formed of only the mesh metal film 1542 without the transparent conductive film 1541, or may be formed of the transparent conductive film 1541 having a mesh shape without the mesh metal film 1542. Here, the mesh metal film 1542 is formed to have a mesh shape using a conductive layer of at least one of Ti, Al, Mo, MoTi, Cu, Ta, and ITO, so as to have higher conductivity than the transparent conductive film 1541. For example, the mesh metal film 1542 is formed in a triple-layer structure such as a stack of Ti/Al/Ti, MoTi/Cu/MoTi, or Ti/Al/Mo. Thereby, the resistance and the capacitance of the first and second touch electrodes 152e and 154e and the first bridge 152b may be reduced, and the RC time constant may be reduced, which may result in increased touch sensitivity. In addition, since the mesh metal film 1542 of each of the first and second touch electrodes 152e and 154e and the first bridge 152b has a very small line width, it is possible to prevent the aperture ratio and transmissivity from being lowered by the mesh metal film 1542. In addition, at least one of the first touch electrode 152e and the second touch electrode 154e and the first and second bridges 152b and 154b may include a plurality of open areas 153. For example, the first touch electrode 152e and the second touch electrode 154e, and the first bridges 152b include the plurality of open areas 153. The first bridge 152b including the open areas 153 shown in FIG. 10A has a reduced opaque area, as compared to the first bridge 152b including no open areas shown in FIG. 3. Therefore, reflection of external light by the first bridges 152b may be reduced and, thus, lowering of visibility may be prevented. The plurality of open areas 153 are formed to overlap light-emitting areas of the light-emitting element 120 and the mesh metal film 1542 of each of the first and second touch electrodes 152e and 154e and the first bridge 152b are formed to overlap the bank 128, thereby preventing deterioration in the aperture ratio and the transmittance attributable to the mesh metal film 1542.

As is apparent from the above description, according to the present disclosure, during the formation of a bridge, a touch routing line and a display link, which are formed of the same material as the bridge, are protected by a passivation layer, which has a smaller thickness than an inorganic encapsulation layer. Thus, since a separate touch buffer layer for protecting the touch routing line and the display link is not necessary, a touch buffer layer, which is disposed between an encapsulation layer and a touch sensor, may be eliminated, whereby the structure may be simplified.

In addition, the passivation layer, which has a smaller thickness than the inorganic encapsulation layer, is disposed on the touch routing line and the display link. Thus, during the process of etching the passivation layer to form a display pad contact hole and a touch pad contact hole, it is possible to prevent damage to the bridge exposed by the touch contact hole.

In addition, since the passivation layer is disposed in a non-active area, it is possible to minimize or prevent the permeation of external moisture or oxygen into a light-emitting stack, thereby improving moisture resistance.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A display device including an active area and a non-active area, the non-active area having a bending area, the display device comprising:
   a substrate;
   a thin-film transistor disposed on the substrate in the active area;
   a light-emitting element disposed on the substrate in the active area and electrically connected to the thin-film transistor;
   an encapsulation layer disposed on the light-emitting element;
   a touch sensor disposed on the encapsulation layer;
   a touch pad disposed in the non-active area;
   a first routing line disposed in the non-active area, the first routing line including a first portion disposed in an area between the active area and the bending area, and a second portion disposed in an area between the bending area and the touch pad;
   a second routing line disposed in the bending area; and
   an organic insulation layer disposed on the second routing line in the bending area,
   wherein the first portion of the first routing line and the second portion of the first routing line are separated from each other on an upper surface of the organic insulation layer in the bending area, and
   wherein the first routing line electrically connects the touch sensor to the touch pad via the second routing line.

2. The display device according to claim 1, further comprising:
   a passivation layer disposed on the thin-film transistor and extending into the non-active area.

3. The display device according to claim 2, wherein the encapsulation layer comprises at least one inorganic encapsulation layer, and the passivation layer has a smaller thickness than the at least one inorganic encapsulation layer.

4. The display device according to claim 1, wherein the organic insulation layer contacts the second routing line in the bending area.

5. The display device according to claim 1, wherein the first portion of the first routing line is disposed on a first lateral surface of the organic insulation layer, and
   the second portion of the first routing line is disposed on a second lateral surface of the organic insulation layer.

6. The display device according to claim 5, wherein the first portion of the first routing line overlaps a first area of the upper surface of the organic insulation layer,
   the second portion of the first routing line overlaps a third area of the upper surface of the organic insulation layer, and
   the first routing line does not overlap a second area of the upper surface of the organic insulation layer in the bending area.

7. The display device according to claim 6, wherein the first area and the third area of the upper surface of the organic insulation layer is an edge portion of the upper surface of the organic insulation layer, and
   the second area of the upper surface of the organic insulation layer is a central portion of the upper surface of the organic insulation layer.

8. The display device according to claim 1, wherein the organic insulation layer is formed of an organic material, the organic insulation material more elastic than an inorganic insulation material.

9. The display device according to claim 1, wherein the touch sensor comprises:
- a plurality of first touch electrodes arranged in a first direction on the encapsulation layer;
- a plurality of second touch electrodes arranged in a second direction on the encapsulation layer;
- a first bridge electrically connecting the first touch electrodes to each other; and
- a second bridge electrically connecting the second touch electrodes to each other and intersecting the first bridge with a touch insulation film interposed therebetween.

10. The display device according to claim 9, wherein the second routing line is formed of the same material as the second bridge.

* * * * *